(12) United States Patent
McNeil et al.

(10) Patent No.: US 7,005,193 B2
(45) Date of Patent: Feb. 28, 2006

(54) METHOD OF ADDING MASS TO MEMS STRUCTURES

(75) Inventors: Andrew C. McNeil, Scottsdale, AZ (US); Gary Li, Gilbert, AZ (US); Gary J. O'Brien, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 170 days.

(21) Appl. No.: 10/426,148

(22) Filed: Apr. 29, 2003

(65) Prior Publication Data

US 2004/0219340 A1 Nov. 4, 2004

(51) Int. Cl.
*B32B 15/00* (2006.01)
*G01P 15/02* (2006.01)
*C23F 1/00* (2006.01)

(52) U.S. Cl. .................. 428/450; 428/446; 73/514.01; 73/514.36; 73/514.38; 216/2; 216/99

(58) Field of Classification Search ............... 428/446, 428/450; 73/514.01, 514.36, 514.38; 216/2, 216/99

See application file for complete search history.

(56) References Cited

U.S. PATENT DOCUMENTS

| | | | | |
|---|---|---|---|---|
| 4,901,570 A | * | 2/1990 | Chang et al. | 73/514.29 |
| 5,726,480 A | * | 3/1998 | Pister | 257/415 |
| 5,777,227 A | * | 7/1998 | Cho et al. | 73/514.38 |
| 5,969,250 A | * | 10/1999 | Greiff | 73/514.38 |
| 6,401,536 B1 | * | 6/2002 | O'Brien | 73/514.38 |
| 6,619,123 B1 | * | 9/2003 | Gianchandani et al. | 73/514.29 |

FOREIGN PATENT DOCUMENTS

EP 00268351 A1 * 5/1988

OTHER PUBLICATIONS

Liang-Yu Chen, "Process Development for the Integration of MEMS and RF Devices", Cornell Nanofabrication Facility, National Nanofabrication Users Network, pp. 20-21 (1999).

* cited by examiner

Primary Examiner—Stephen Stein
(74) Attorney, Agent, or Firm—John A. Fortkort; Fortkort & Houston P.C.

(57) ABSTRACT

A proof mass (11) for a MEMS device is provided herein. The proof mass comprises a base (13) comprising a semiconductor material, and at least one appendage (15) adjoined to said base by way of a stem (21). The appendage (15) comprises a metal (17) or other such material that may be disposed on a semiconductor material (19). The metal increases the total mass of the proof mass (11) as compared to a proof mass of similar dimensions made solely from semiconductor materials, without increasing the size of the proof mass. At the same time, the attachment of the appendage (15) by way of a stem (21) prevents stresses arising from CTE differentials in the appendage from being transmitted to the base, where they could contribute to temperature errors.

37 Claims, 6 Drawing Sheets

METHOD OF ADDING MASS TO MEMS STRUCTURES

FIELD OF THE INVENTION

The present invention relates generally to MEMS devices, and more particularly to proof masses for MEMS devices.

BACKGROUND OF THE INVENTION

Advancements in micromachining and other microfabrication techniques and processes have enabled the fabrication of a wide variety of MicroElectroMechanical Sensors (MEMS) and other such devices. These devices include moving rotors, gears, switches, accelerometers, miniaturized sensors, actuator systems, and other such structures.

One promising application of MEMS technology is in the area of inertial sensors. Inertial sensors operate by sensing displacements of a proof mass mounted on a compliant suspension. The proof mass displacement $\Delta X$ is related to the mass (m) of the proof mass, the acceleration (a), and the spring constant (k) of the compliant suspension as shown in EQUATION 1:

$$\Delta X = ma/k \quad \text{(EQUATION 1)}$$

The sensitivity of the inertial sensor is limited by the ability of the device to accurately sense displacements of the proof mass. Typically, as accelerations become small, the resulting displacements of the proof mass also become small, and it becomes increasingly difficult for the inertial sensor to accurately sense the displacement and thereby accurately register the acceleration.

The sensitivity of the inertial sensor may be increased by decreasing the spring constant (k), since this will result in a larger displacement of the proof mass. However, as the spring constant is decreased, the sensor becomes increasingly prone to vertical stiction. Stiction, which refers to the phenomenon in which a moving component of a MEMS device adheres to an adjacent surface, typically occurs when surface adhesion forces between the component and the adjacent surface are higher than the mechanical restoring force of the micro-structure. These surface adhesion forces may arise from capillary forces, electrostatic attraction, or direct chemical bonding. In a MEMS device such as an inertial sensor, vertical stiction can cause the device to malfunction. Hence, improvements in the sensitivity of an inertial sensor through reduction in the spring constant alone are limited by the consequent reductions in device reliability.

As suggested by EQUATION I above, the sensitivity of the inertial sensor may also be increased by increasing the mass of the proof mass. However, there are practical limitations to the improvements achievable in the sensitivity of an inertial sensor by increasing the proof mass. In particular, in conventional MEMS devices, the proof mass is constructed out of silicon or other semiconductor materials. Consequently, it is difficult to substantially increase the weight of the proof mass without also substantially increasing the size of the sensor, a result which is very undesirable in light of the current need in the art for further miniaturization of these devices.

There is thus a need in the art for a method for increasing the sensitivity of inertial sensors or other MEMS devices, without adversely affecting device reliability. There is also a need in the art for devices so made. These and other needs are met by the methodologies and devices disclosed herein and hereinafter described.

SUMMARY OF THE INVENTION

In one aspect, a proof mass for a MEMS device is provided which comprises a base comprising a first material, and at least one appendage attached to said base by way of a stem, said appendage comprising a second material. In some embodiments, the appendage may comprise both the first and second material. The first material is preferably a commonly used MEMS material such as polysilicon, and the second material is preferably a metal such as gold or aluminum. The appendage may be attached laterally to the base by way of said stem, or the appendage may be mounted on a major surface of the base. The appendage preferably comprises a semiconductor substrate having a layer of metal disposed thereon.

In another aspect, a proof mass for a MEMS device is provided which comprises a central mass connected to a substrate by a plurality of anchors, and a plurality of appendages, wherein each appendage comprises a metal and is attached to the central mass by way of a stem.

In another aspect, a method for making a proof mass is provided. In accordance with the method, a substrate is provided, and a proof mass is defined on the substrate. The proof mass comprises a base with an appendage attached thereto by way of a stem. The base comprises a first material, which is preferably a semiconductor. A second material is then deposited on the appendage. The second material preferably has a higher density than the first material, and is preferably a metal such as aluminum or gold.

In still another aspect, a method for making a proof mass for a MEMS device is provided. In accordance with the method, a substrate is provided, and a base comprising a first material is defined on the substrate. The base may be supported on the substrate by way of one or more anchors. An appendage comprising a second material is then formed, the appendage being attached to the base by way of a stem. The second material preferably has a higher density than the first material. The step of forming the appendage may comprise the steps of depositing a sacrificial layer over the base, depositing a layer of the second material over the sacrificial layer, and partially removing the sacrificial layer. The sacrificial layer may contain an opening that defines the stem. In some embodiments, after the sacrificial layer is deposited over the base, a trench is formed in the sacrificial layer which divides the sacrificial layer into a first portion which is interior to the trench and a second portion which is exterior to the trench. The trench may then be backfilled with a third material. In such embodiments, the sacrificial layer may be partially removed by chemical etching, and the third material may be chosen as a material which is resistant to the chemical etch used to partially remove the sacrificial layer.

These and other aspects are described in further detail below.

DETAILED DESCRIPTION

It has now been found that the above noted needs may be met by constructing a portion of the proof mass for a MEMS device out of metals or other high density materials. Such an approach has heretofore not been feasible because of the coefficient of thermal expansion (CTE) mismatch that typically exists between such materials and the materials, such as polysilicon, which are typically used for proof mass construction. For example, polysilicon has a coefficient of thermal expansion of about 3.9, while aluminum has a coefficient of thermal expansion of about 16. These CTE mismatches would tend to result in temperature-induced deformations in the proof mass area over the normal operating range of −40° C. to 125° C. (especially if the surface area of the metal/polysilicon interface is relatively large), thus resulting in temperature errors in the device. This would be especially problematic in capacitive sensors, which are designed to detect very small displacements (e.g., in the nanometer range) in the proof mass. However, it has now been found that this problem can be overcome through the use of proof masses having designs that allow such CTE mismatches to be decoupled from the portion of the proof mass that undergoes displacements to register inertia. Such designs, which permit the sensitivity of the device to be increased without adversely affecting device reliability, size or accuracy, are discussed in greater detail below.

Figure 1:
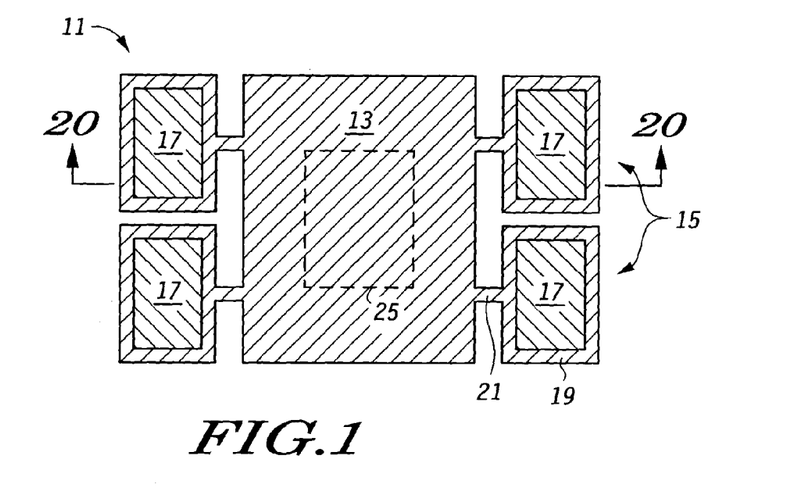
FIG. 1 is an illustration of a first embodiment of a proof mass made in accordance with the teachings herein.
Figure 20:
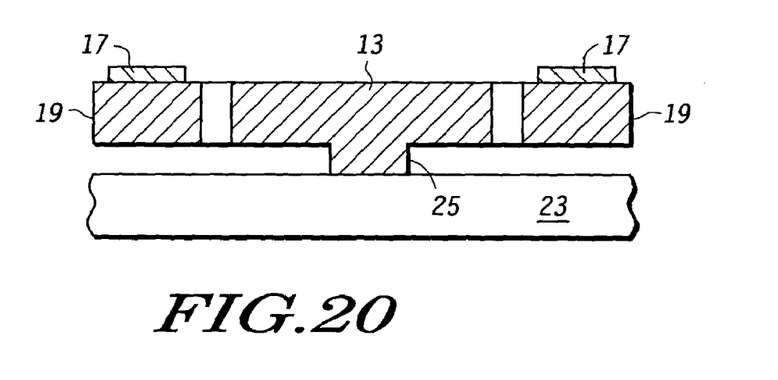
FIG. 20 is a cross-sectional view taken along LINE 20—20 of FIG. 1.

FIG. 1 depicts a top view of a first embodiment of a proof mass made in accordance with the teachings herein. A cross-sectional view of this embodiment taken along LINE 20—20 is shown in FIG. 20. The proof mass 11 in this particular embodiment comprises a base 13 having four appendages 15 attached thereto, it being understood that similar embodiments could be made containing almost any desired number of appendages, including just one. Each appendage consists of a layer of a metal 17, such as aluminum or gold, which is disposed on a semiconductor material 19. Each appendage is attached to the base by way of a stem 21. The base 13 of the proof mass is typically formed on a substrate 23 (see FIG. 20) and is attached thereto by way of one or more anchors 25. For simplicity of illustration, the base 13 is shown in FIG. 1 as being attached to the substrate by a single central anchor 25. Preferably, however, the base of the proof mass is mounted on a compliant suspension system of the type illustrated in FIG. 12, and is provided with a plurality of fixed beams arranged around its periphery that allow displacements of the base to be sensed.

Since the appendages have a metal layer deposited upon them, these appendages have greater mass per unit area than would be the case if they were formed entirely from conventional proof mass materials such as polysilicon. Consequently, the metal layer serves to substantially increase the overall mass of the proof mass without substantially increasing its size. As a result, the proof mass undergoes larger displacements, in response to the same acceleration, than a comparable device employing a conventional proof mass made only from conventional proof mass materials. Hence, a device equipped with a proof mass of the type disclosed herein is capable of sensing smaller accelerations (see EQUATION 1 above).

Moreover, since the appendages are attached to the base by way of one or more narrow stems (such stems may be, for example, about 1 to about 10 microns in width), the amount of stress transmitted from an appendage to the base is minimal. Consequently, the CTE mismatch between the metal and underlying semiconductor material in the appendage does not result in significant deformation of the base. Since the device is designed so that only deformations in the base are sensed as accelerations, temperature errors are minimized.

One of the advantages offered by a proof mass of the type depicted in FIG. 1 is that its formation can be readily integrated into a MEMS fabrication process without necessitating any additional process steps. In particular, any semiconductor portion of the appendages may be formed as part of the process used to define the base of the proof mass. Moreover, if the appendages comprise metal layers, these layers may be formed as part of the same processing step that defines the circuitry or other metallic components of the device.

A further advantage of a proof mass scheme such as that depicted in FIG. 1 is that it is applicable to proof masses having a center of rotation. Such proof masses may be used, for example, in MEMS devices such as angular accelerometers and rate sensors which sense torque applied to the proof mass. In these devices, the proof mass schemes described herein allow mass to be selectively added to the proof mass at positions away from the proof mass center of rotation, thereby increasing their moment of inertia and significantly enhancing their sensitivity. One example of an angular accelerometer made in accordance with the teachings herein is described below in the discussion relating to FIG. 18.

Figure 2:
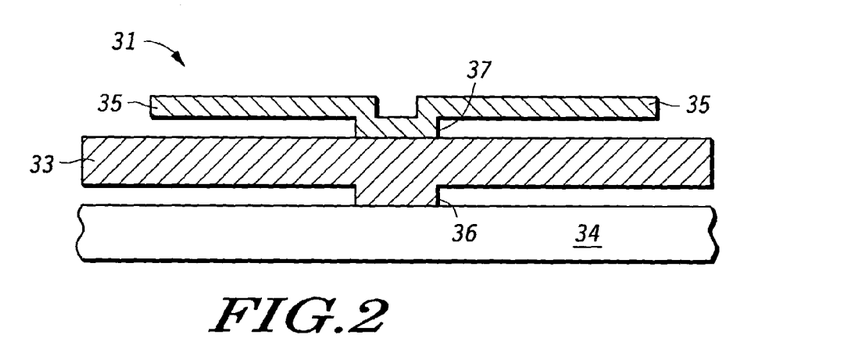
FIG. 2 is a cross-sectional view of a second embodiment of a proof mass made in accordance with the teachings herein.
Figure 19:
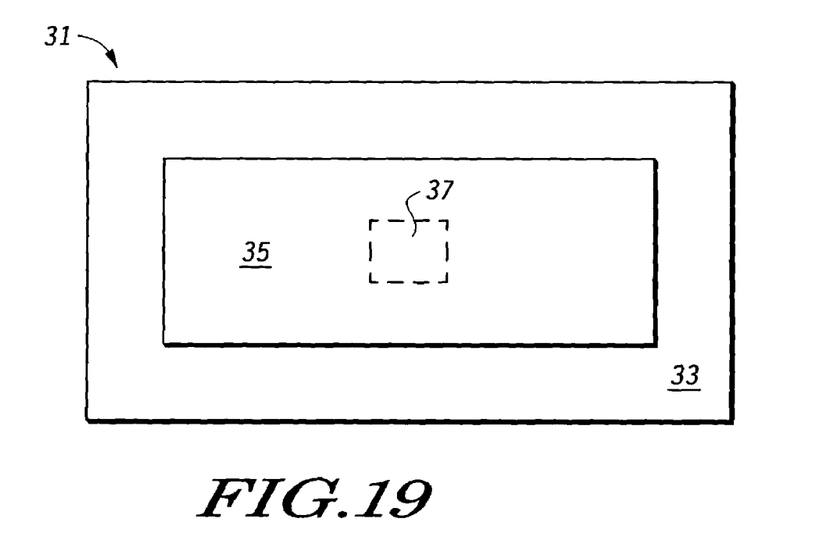
FIG. 19 is a top view of the embodiment of FIG. 2.

FIG. 2 depicts a cross-sectional view of a second embodiment of a proof mass made in accordance with the teachings herein. A top view of this embodiment is shown in FIG. 19. The proof mass 31 in this embodiment again comprises a base 33 having one or more appendages 35 mounted thereon by way of a stem 37. The appendages may comprise one or more metals disposed on a semiconductor material, or may be constructed solely out of one or more metals. The base 33 of the proof mass is attached to a substrate 34 by way of an anchor 36. In contrast to the proof mass depicted in FIG. 1, however, in the proof mass depicted in FIG. 2, the stem 37, which may comprise a metal or a semiconductor material such as polysilicon, is vertically formed on one of the major surfaces of the base. The stem 37 has a sufficiently narrow width (e.g., about 1 to 10 microns) so that the amount of stress arising from any CTE mismatches in the appendages which are transmitted through the stem is minimal. Similarly, the narrowness of the stem minimizes any deformations in the base which result from CTE mismatches between the material of the stem and the material of the base.

In the embodiments described above, the mass of the proof mass has been increased through the addition of a layer of a dense material, such as a metal, to it. However, in some applications, the overall mass of the proof mass may also be increased by building up the proof mass vertically, through the addition of layers or other structures to it, whether or not this involves the use of materials that have greater density than the semiconductor materials commonly used in MEMS structures. While the use of lower density materials may have the effect of increasing the overall size of the proof mass in the vertical direction, this may be acceptable in some applications so long as the proof mass area in the horizontal direction is not significantly increased.

The following examples illustrate the effectiveness of the proof mass designs disclosed herein in reducing the amount of CTE differential stress transmitted to the base. COMPARATIVE EXAMPLE 1 illustrates the amount of CTE differential stress that would be transmitted to the base if the appendage was not separated from the base by way of a stem (that is, if the appendage adjoins the base along its entire width). EXAMPLE 1 illustrates the reduction in the amount of CTE differential stress transmitted to the base when the appendage is separated from the base by way of a stem. Both examples assume an appendage consisting of aluminum deposited on a layer of polysilicon.

COMPARATIVE EXAMPLE 1

This example illustrates the transmission of CTE differential stress between an appendage and the base of a proof mass for a proof mass in which the appendage adjoins the base across its entire width, and in which the appendage consists of dissimilar materials (i.e., aluminum and polysilicon).

Figure 4:
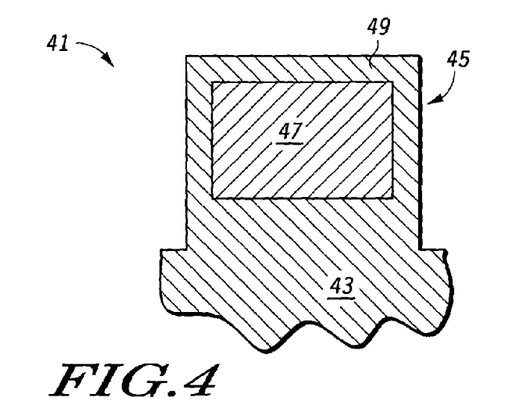
FIG. 4 is an illustration of the proof mass modeled in FIG. 3.

A modeling experiment was conducted to calculate the maximum deflection arising from CTE stress differentials in a proof mass of the type depicted in FIG. 4. That proof mass 41 consists of a polysilicon base 43 having an adjoining square appendage 45. The appendage consists of a layer of polysilicon 49 upon which is deposited a layer 47 of aluminum 3 microns thick. The sides of the appendage are 100 microns in length.

The appendage adjoins the base along its entire width, and the major surfaces of the appendage are parallel to those of the base.

Figure 3:
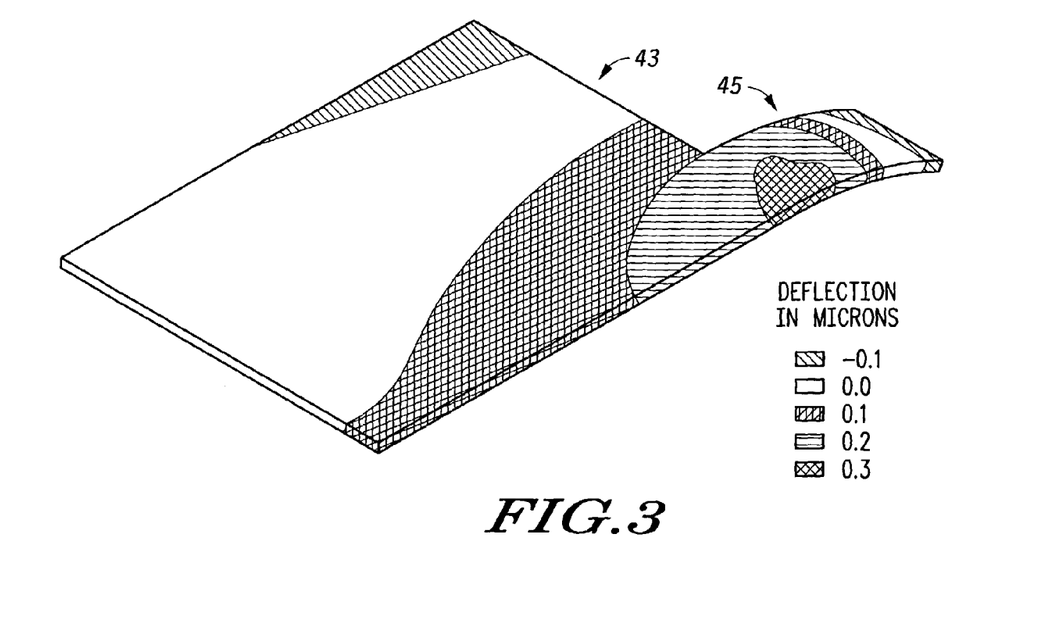
FIG. 3 is an illustration depicting deflection as modeled for a proof mass in which the appendage comprises metal on top of polysilicon and is connected to the central mass along the full length of the appendage.

The calculated stress over a temperature cycle of 25° C. to 125° C. is illustrated in FIG. 3. The maximum deflection occurring in the base 43 (as calculated along an axis perpendicular to the major surface of the base) was within the range of about 200 nm (0.2 microns) to about 300 nm (0.3 microns). The maximum deflection occurring in the appendage 45 (as calculated along an axis perpendicular to the major surface of the appendage) was about 300 nm (0.3 microns). It is to be noted here that the deflections in the base are of primary importance, since they result directly in sensor errors (that is, the device reads an acceleration when none has occurred). By contrast, deflections or distortions in the appendage only effect sensor readings to the extent that they cause deflections in the base.

EXAMPLE 1

This example illustrates the transmission of CTE differential stress between an appendage and the base of a proof mass for a proof mass in which the appendage is separated from the base by way of a narrow stem, and in which the appendage consists of dissimilar materials (i.e., aluminum and polysilicon).

Figure 6:
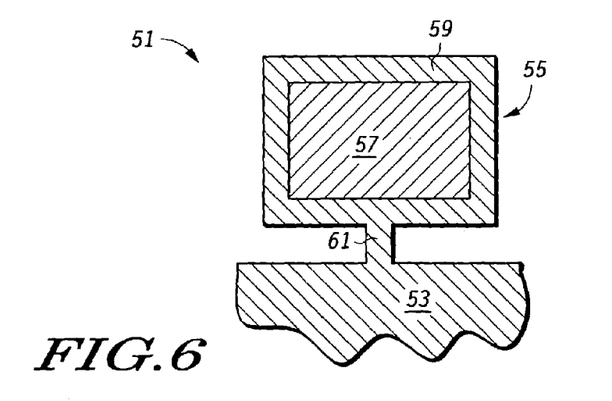
FIG. 6 is an illustration of the proof mass modeled in FIG. 5.

The modeling experiment of COMPARATIVE EXAMPLE 1 was repeated, except that a proof mass of the type illustrated in FIG. 6 was assumed. That proof mass 51 consists of a polysilicon base 53 having an adjoining square appendage 55. The appendage consists of a layer of polysilicon 59 upon which is deposited a layer 57 of aluminum 3 microns thick. The sides of the appendage are 100 microns in length. The appendage is separated from the base by way of a stem 61 which has a width of 3 microns and a length of 2 microns, and the major surfaces of the appendage are parallel to those of the base.

Figure 5:
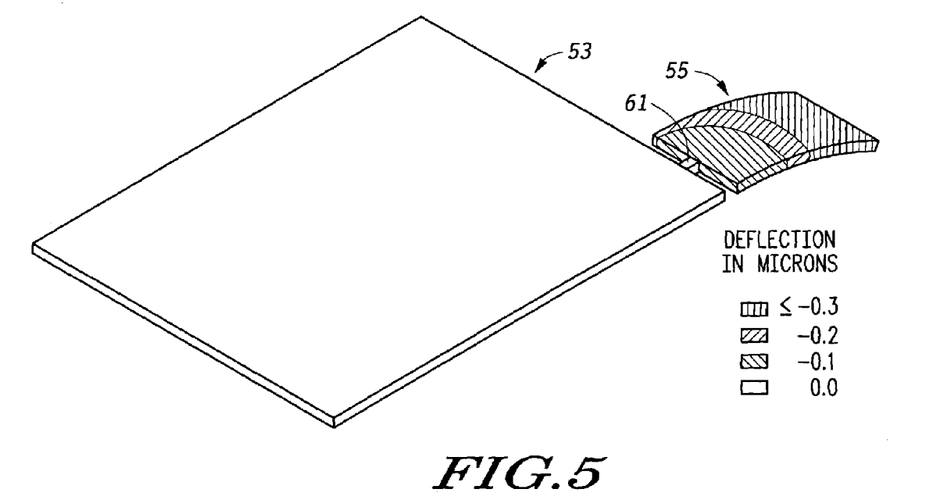
FIG. 5 is an illustration depicting deflection as modeled for a proof mass in which the appendage comprises metal on top of polysilicon and is connected to the central mass by a stem.

The calculated stress over a temperature cycle of 25° C. to 125° C. is illustrated in FIG. 5. The maximum deflection in the base 53 (as calculated along an axis perpendicular to the major surface of the base) was about 0.01 nm (it is shown as 0.0 in FIG. 5 due to rounding). The maximum deflection occurring in the appendage 55 (as calculated along an axis perpendicular to the major surface of the appendage) was about 300 nm (0.3 microns). Hence, compared to the proof mass of FIG. 4, the thermally induced deflection of the base in the proof mass of FIG. 6 is about 20,000 to 30,000 times less. Without wishing to be bound by theory, this result is believed to be due to the effect of the stem 61 in FIG. 6 in reducing the amount of CTE differential stress transmitted to the base.

The proof masses described herein can be fabricated through a number of different routes. FIGS. 7–11 illustrate one possible method for making a proof mass of increased mass in accordance with the teachings herein. This particular method involves the addition of a metal to selected portions of the proof mass to produce a proof mass similar to that depicted in FIG. 2.

Figure 7:
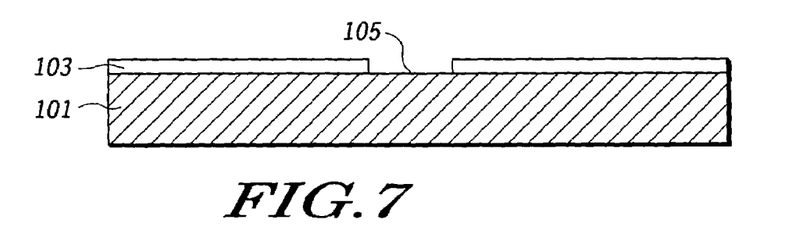
FIGS. 7–11 are illustrations depicting a method for making a proof mass of increased mass in accordance with the teachings herein.
Figure 8:
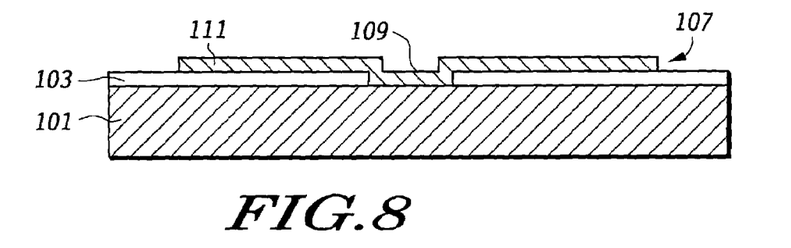

As shown in FIG. 7, a silicon substrate 101 is provided, and a first sacrificial layer 103 of phosphorsilicate glass (PSG) about 2 microns in thickness is deposited and patterned on the substrate to form an opening 105 for the anchor for the proof mass. Then, as shown in FIG. 8, a layer of polysilicon 107 about 3 microns thick is deposited and patterned over the first sacrificial layer 103 to form the base of the proof mass. The base comprises an anchor 109 which is adhered to the silicon substrate 101, and lateral portions 111 which extend over the first sacrificial layer 103.

Figure 9:
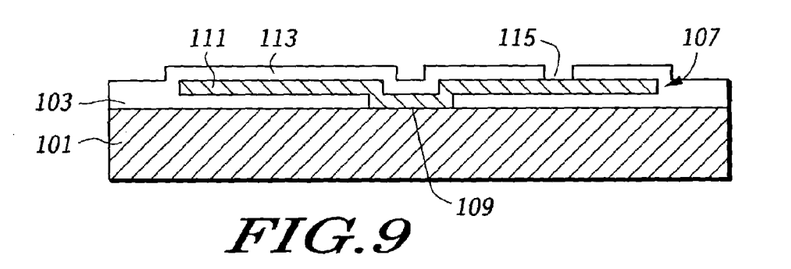

As shown in FIG. 9, a second sacrificial layer of PSG 113 about 2 microns thick is then deposited and patterned over the layer of polysilicon 107. The second sacrificial layer contains an opening 115 which exposes a portion of the underlying polysilicon layer 107.

Figure 10:
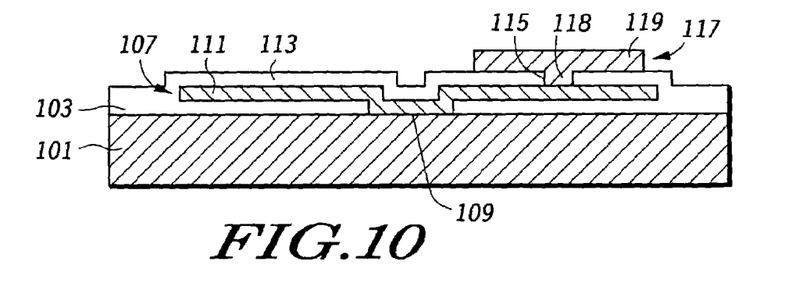
Figure 11:
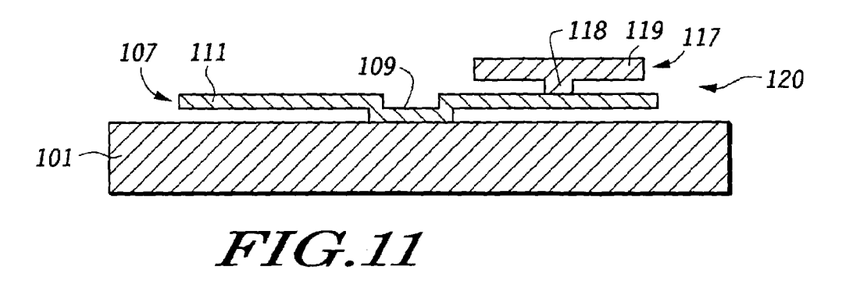

A layer of aluminum 117 about 3 microns in thickness is then deposited and patterned over the opening 115 as shown in FIG. 10 so that it adheres to the underlying layer of polysilicon 107. In the particular embodiment shown, the layer of aluminum 117 comprises a first portion 118 (the stem) that is in contact with the underlying lateral portion 111 (the base) of the layer of polysilicon 107, and a second portion 119 (the appendage) that extends over the second sacrificial layer. The resulting substrate is then subjected to a sacrificial etch as shown in FIG. 11. The etchant and etch conditions are selected so that all, or a sufficient portion of, the first and second sacrificial layers are removed, thereby achieving release of the proof mass 120.

The methodology depicted in FIGS. 7–11 utilizes a series of deposition and patterning steps to create a proof mass in which one or more appendages are attached to a surface of the base of the proof mass. Release of the proof mass is then achieved through etching of one or more sacrificial layers in the structure. A similar approach may be used to produce a proof mass of the type depicted in FIG. 1 which comprises a base with one or more appendages attached laterally thereto.

Thus, to produce a proof mass such as that depicted in FIG. 1 and FIG. 20, the processing steps shown in FIGS. 7 and 8 can be slightly modified so that the deposition and patterning steps used to create the anchor 109 and lateral portions 111 of the base 107 in FIG. 8 would also be used to create anchor 25, base 113, the stem 21 and the bottom portion 19 of the appendage of the device in FIG. 1 and FIG. 20. Preferably, the base, stem and bottom portions of the appendages all comprise the same material so that they can be patterned out of a single layer. A selective metal deposition step may then be used to form the layer of metal 17 on the appendages 15 of FIG. 1 (alternatively, the metal may be deposited non-selectively and then patterned and etched) and the structure may be released through a sacrificial etch.

Figure 12:
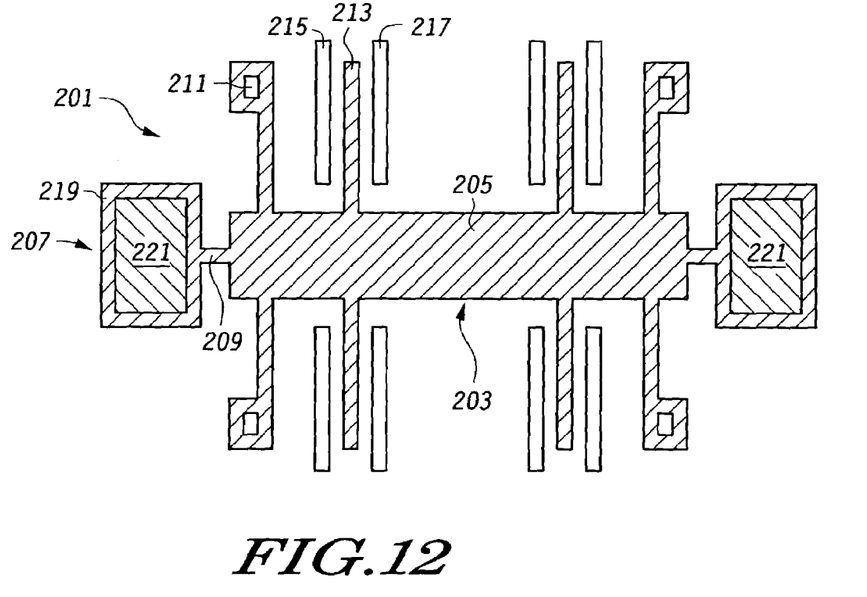
FIG. 12 is an illustration of a MEMS device that includes a proof mass made in accordance with the teachings herein.

FIG. 12 illustrates one possible, non-limiting example of a MEMS device (here, an inertial sensor) which incorporates a proof mass of the type described herein. The device 201 has a proof mass area 203 which consists of a base 205 having two appendages 207 adjoined thereto by way of a stem 209. The base is attached to a substrate (not shown) by a plurality of anchors 211, and is equipped with a plurality of moving fingers 213. Each of the moving fingers is disposed between first 215 and second 217 fixed fingers, the later of which are typically attached to a substrate by one or more anchors (not shown). Each appendage 207 consists of first 219 and second 221 layers, wherein the first layer 219 preferably consists of the same material as the base, and wherein the second layer 221 comprises a metal.

Figure 13:
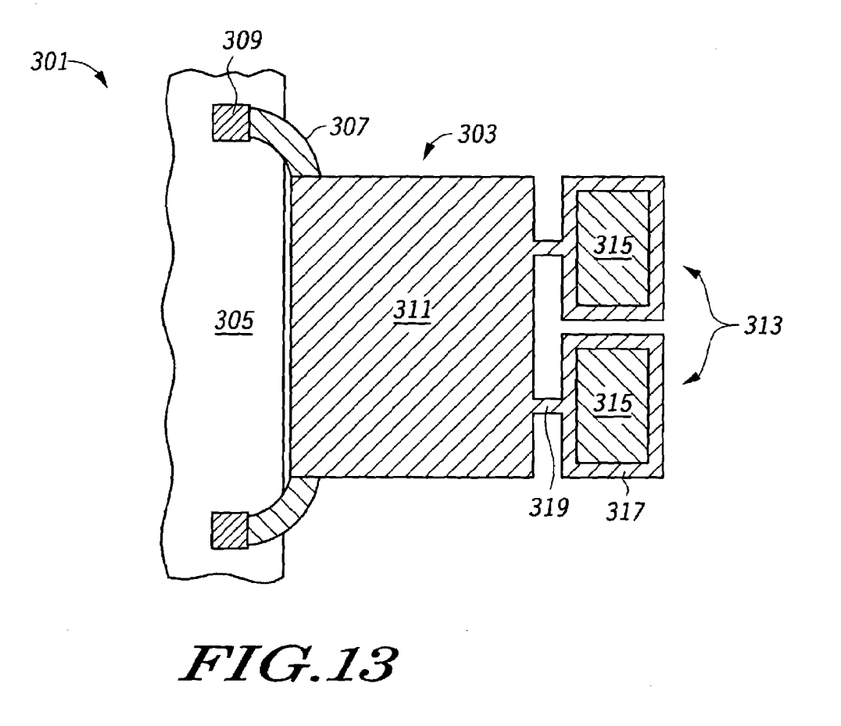
FIG. 13 is an illustration of a torsion z-axis linear accelerometer made in accordance with the teachings herein.

FIG. 13 illustrates a torsion z-axis linear accelerometer made in accordance with the teachings herein. The accelerometer 301 comprises a proof mass 303 which is mounted to a substrate 305 by way of torsion beams 307 and anchors 309. The proof mass 303 in this particular embodiment comprises a base 311 having two appendages 313 attached thereto, it being understood that similar embodiments could be made containing other numbers of appendages. Each appendage consists of a layer of a metal 315, such as aluminum or gold, which is disposed on a semiconductor material 317 which preferably is formed of the same material as the base. Each appendage adjoins the base by way of a stem 319.

Figure 14:
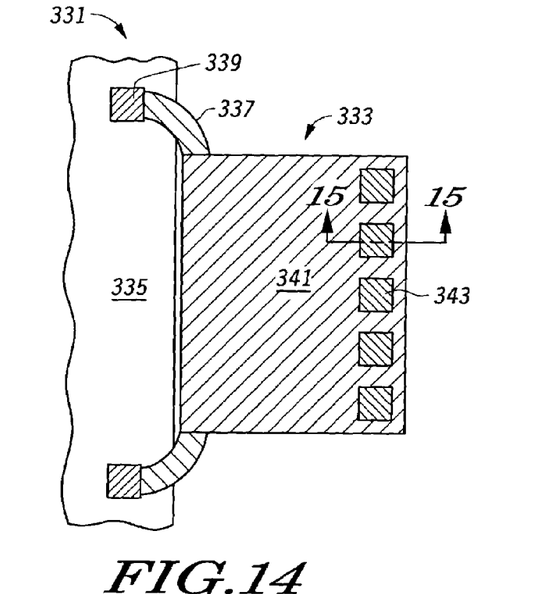
FIG. 14 is an illustration of a torsion z-axis linear accelerometer made in accordance with the teachings herein.
Figure 15:
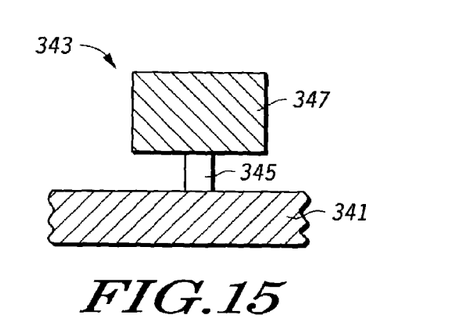
FIG. 15 is a cross-section taken along LINE 15—15 of FIG. 14.

FIGS. 14 and 15 illustrate another example of a torsion z-axis linear accelerometer made in accordance with the teachings herein. The accelerometer 331 comprises a proof mass 333 which is adjoined to a substrate 335 by way of torsion beams 337 and anchors 339. The proof mass 333 in this particular embodiment comprises a base 341 upon which is formed a series of structures 343, each comprising a stem 345 (see FIG. 15) and a square-shaped appendage 347. These structures are preferably fabricated from one or more metals.

Figure 16:
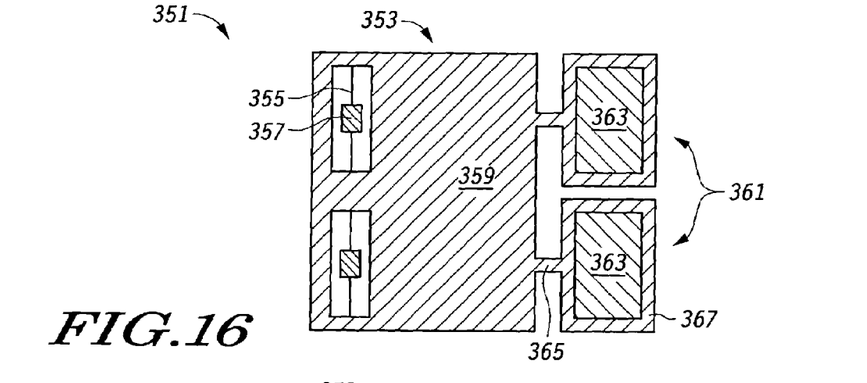
FIG. 16 is an illustration of a torsion z-axis linear accelerometer made in accordance with the teachings herein.

FIG. 16 illustrates another example of a torsion z-axis linear accelerometer made in accordance with the teachings herein. The accelerometer 351 comprises a proof mass 353 which is mounted to a substrate (not shown) by way of torsion beams 355 and anchors 357. The proof mass 353 in this particular embodiment comprises a base 359 having two appendages 361 attached thereto, it being understood that similar embodiments could be made containing other numbers of appendages. Each appendage consists of a layer of a metal 363, such as aluminum or gold, which is disposed on a semiconductor material 367 which preferably is formed of the same material as the base. Each appendage adjoins the base by way of a stem 365.

Figure 17:
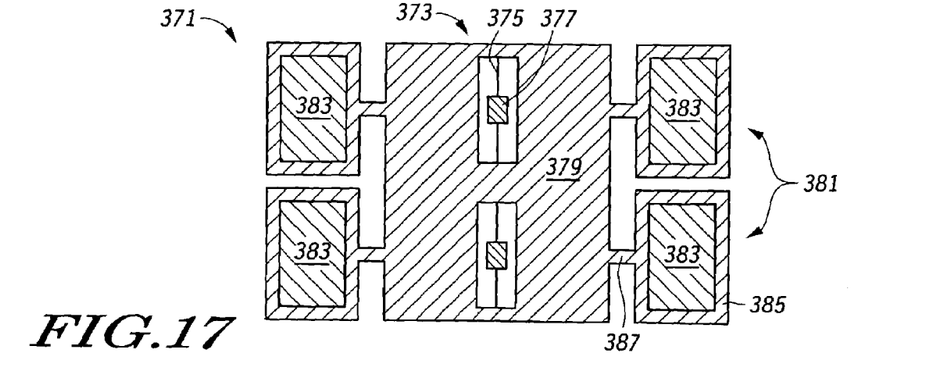
FIG. 17 is an illustration of a torsion z-axis linear accelerometer made in accordance with the teachings herein.

FIG. 17 illustrates an example of a torsion y-axis linear accelerometer made in accordance with the teachings herein. The accelerometer 371 comprises a proof mass 373 which is mounted to a substrate (not shown) by way of torsion beams 375 and anchors 377. The proof mass 373 in this particular embodiment comprises a base 379 having four adjoining appendages 381, it being understood that similar embodiments could be made containing other numbers of appendages. Each appendage consists of a layer of a metal 383, such as aluminum or gold, which is disposed on a semiconductor material 385 which preferably is formed of the same material as the base. Each appendage adjoins the base by way of a stem 387.

Figure 18:
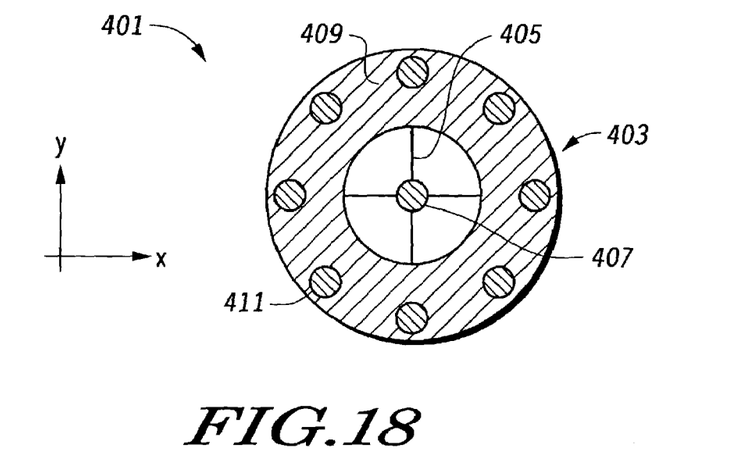
FIG. 18 is an illustration of a torsion z-axis angular accelerometer made in accordance with the teachings herein.

FIG. 18 depicts a torsion z-axis angular accelerometer made in accordance with the teachings herein. The accelerometer 401 comprises a proof mass 403 which is mounted to a substrate (not shown) by way of beam springs 405 and a central anchor 407. The proof mass 403 in this particular embodiment comprises an annular base 409 having a plurality of mushroom-shaped appendages 411 attached to a surface thereof. The mushroom-shaped appendages 411 have a profile in cross-section similar to the appendage shown in FIG. 15.

Several variations are possible with the device shown in FIG. 18. For example, the beam springs 405 used in the device may be straight, folded, or may have a curved profile between the central anchor 407 and the annular base 409 of the proof mass. Also, the central anchor 407 may be replaced by multiple anchors which are symmetrically disposed about the center of rotation in the z-axis as shown, for example, in some of the devices depicted in U.S. Pat. No. 6,401,536 (O'Brien).

Various materials may be used to increase the mass of proof masses in accordance with the teachings herein. Suitable materials include, for example, metals, such as aluminum, gold, copper, lead, metal oxides, metal nitrides, metal silicates, metal sulfides, metal halides, metal solders (such as, for example, AuSn and PbSn solders) and the like, and mixtures or alloys of two or more of the foregoing. Non-metals, such as, for example, PSG and polysilicon, may also be employed. Of the foregoing, the use of gold or aluminum in the appendages of the proof mass are especially preferred. Gold is preferred because of its high density and inertness, and aluminum is preferred because it is a metal already employed in many current process flows.

In some of the embodiments described herein, the mass of the proof mass has been increased by the provision of appendages having only a single additional layer of metal or other high density material added to it. However, one skilled in the art will appreciate that almost any desired number of additional layers could be added to the appendages in this manner so as to increase the mass of the proof mass, and that these additional layers could have the same or different compositions.

Various stem shapes and configurations may be used to make proof masses in accordance with the teachings herein. Thus, for example, the stem may be circular, elliptical, polygonal (e.g., square, hexagonal, etc.), or irregular in cross-sectional shape, and it may have a cross-sectional shape that varies or remains the same along the length of the stem.

The stem is preferably sufficiently thick so that it can support the mass of the appendage, yet not so thick that substantial amounts of CTE stress can be transmitted through the stem from the appendage to the base. The dimensions of the stem may vary, and may be dictated in part, for example, by the choice of materials for the base, appendages and stem, the CTE differential between the materials of the appendages, and/or the mass of the appendages. Typically, however, the stem will have a maximum width, as measured along an axis orthogonal to its length (here length is used in reference to the dimension of the stem extending from the base to the appendage), within the range of about 0.01 microns to about 20 microns, preferably within the range of about 1.0 microns to about 10 microns, more preferably within the range of about 2 microns to about 8 microns, and most preferably within the range of about 3 microns to about 5 microns. In some embodiments, an appendage may be secured to the base by a plurality of stems.

Moreover, one skilled in the art will appreciate that, while it will be convenient in many applications to add metals and other high density materials as layers to the appendages of a proof mass made in accordance with the teachings herein, these materials may also be added to the appendages in other forms. For example, the appendage could be patterned with a series of trenches or depressions, which could be backfilled with a metal.

Proof masses for inertial sensors and other MEMS devices have been provided herein that have increased mass. Methods for making such proof masses have also been provided. Inertial sensors can be made with these proof masses which have greater sensitivity than sensors based on conventional, lighter proof masses, without adversely effecting the size, reliability or accuracy of the sensor.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for making a proof mass, comprising the steps of:
   providing a substrate;
   defining a proof mass on the substrate, the proof mass comprising a base with an appendage adjoined thereto by way of a stem, the base comprising a first material; and
   depositing a second material on the appendage;
   wherein the first and second materials are diverse.

2. The method of claim 1, wherein the second material has a higher density than the first material.

3. The method of claim 1, wherein the first material is a semiconductor, and wherein the second material is a metal.

4. The method of claim 1, wherein the second material is selected from the group consisting of aluminum and gold.

5. The method of claim 1, wherein the appendage also comprises the first material.

6. The method of claim 5, wherein the appendage further comprises a third material, and wherein the first, second and third materials are diverse.

7. The method of claim 1, wherein the step of defining the proof mass comprises the steps of:
   depositing a layer of the first material on the substrate; and
   patterning the layer of the first material to define the base, appendage and stem.

8. The method of claim 7, further comprising the step of depositing a sacrificial layer on the substrate, and wherein the layer of the first material is deposited over the sacrificial layer.

9. The method of claim 8, wherein the sacrificial layer contains an opening that exposes a portion of the substrate, the opening defining an anchor for the proof mass.

10. A method for making a proof mass for a MEMS device, comprising the steps of:
    providing a substrate;
    defining a base on the substrate, the base comprising a first material; and
    forming an appendage comprising a second material and being attached to the base by way of a stem;
    wherein the second material has a higher density than the first material, and wherein the step of forming the appendage comprises (a) depositing a sacrificial layer over the base, (b) depositing a layer of the second material over the sacrificial layer, and (c) at least partially removing the sacrificial layer while leaving the layer of the second material.

11. The method of claim 10 wherein, after the sacrificial layer is deposited over the base, a trench is formed in the sacrificial layer which divides the sacrificial layer into a first portion which is interior to the trench and a second portion which is exterior to the trench, and further comprising the step of backfilling the trench with a third material, wherein the sacrificial layer is partially removed by chemical etching and wherein the third material is resistant to the chemical etch used to partially remove the sacrificial layer.

12. The method of claim 10, wherein the stem comprises the second material.

13. A MEMS device, comprising:
    a substrate; and
    a proof mass attached to said substrate by at least one anchor, wherein said proof mass is equipped with a base comprising a first material, and is further equipped with at least one appendage adjoined to said base by way of a stem, said appendage comprising a second material which is denser than said first material.

14. The MEMS device of claim 13, wherein said proof mass is attached to said substrate by way of a plurality of anchors.

15. The MEMS device of claim 13, wherein said proof mass is equipped with a plurality of appendages.

16. The MEMS device of claim 13, wherein each of said plurality of appendages is smaller than said base.

17. The MEMS device of claim 13, wherein said at least one appendage is supported above said substrate by way of said base and said stem.

18. A MEMS device, comprising:
    a substrate; and
    a proof mass attached to said substrate by an anchor, said proof mass comprising a first portion which is attached to said anchor and which comprises a first material, and a second portion which is attached to said first portion by way of a stem and which comprises a second material.

19. The MEMS device of claim 18, wherein said second portion is smaller than said first portion.

20. The MEMS device of claim 18, wherein said second portion is not attached to said substrate.

21. The MEMS device of claim 18, wherein said first portion is attached to said anchor by way of a torsion beam.

22. The MEMS device of claim 18, wherein said first portion is attached to said anchor by way of a plurality of torsion beams.

23. The MEMS device of claim 18, wherein said first and second material are diverse, and wherein said second material is denser than said first material.

24. The MEMS device of claim 18, wherein said first material is a semiconductor material, and wherein said second material is a metal.

25. A MEMS device, comprising:
   a substrate; and
   a proof mass comprising (a) a base which is supported on said substrate by way of an anchor, and (b) an appendage which is adjoined to said base by way of a stem;
   wherein said base comprises a first material, and wherein said appendage comprises a second material which is denser than said first material.

26. The device of claim 25, wherein said appendage is adjoined laterally to said base by way of said stem.

27. The device of claim 25, wherein said appendage is adjoined vertically to a major surface of said base by way of said stem.

28. The device of claim 25, wherein said first material comprises polysilicon.

29. The device of claim 25, wherein said stem and said appendage comprise a metal.

30. The device of claim 25, wherein said second material is a metal selected from the group consisting of gold and aluminum.

31. The device of claim 25, wherein said appendage comprises a semiconductor material having a layer of metal disposed thereon as the second material.

32. The device of claim 25, wherein said substrate is distinct from said appendage.

33. The proof mass of claim 25, wherein said base is attached to said anchor by way of a beam.

34. The proof mass of claim 25, wherein said proof mass is supported on said substrate by a plurality of anchors, and wherein said base is attached to each of said plurality of anchors by way of at least one beam.

35. The proof mass of claim 25, wherein said proof mass is supported on said substrate by a plurality of anchors that are arranged around the periphery of said base.

36. The proof mass of claim 25, wherein said substrate is equipped with at least one sensor that allows displacements of the base to be sensed.

37. A proof mass for a MEMS device, comprising:
   a base comprising polysilicon; and
   at least one appendage adjoined to said base by way of a stem, said appendage comprising a second material which is denser than polysilicon.

* * * * *